United States Patent
Kosako et al.

(10) Patent No.: US 6,853,545 B2
(45) Date of Patent: Feb. 8, 2005

(54) STRUCTURE FOR GUIDING FLEXIBLE PRINTED WIRING BOARD THROUGH A HINGE PORTION BETWEEN A BODY AND A SWINGABLE MEMBER

(75) Inventors: Kosei Kosako, Tokyo (JP); Ken Endo, Saitama (JP)

(73) Assignee: PENTAX Corporation, Tokyo (JP)

( * ) Notice: Subject to any disclaimer, the term of this patent is extended or adjusted under 35 U.S.C. 154(b) by 62 days.

(21) Appl. No.: 10/407,265

(22) Filed: Apr. 7, 2003

(65) Prior Publication Data

US 2003/0193783 A1 Oct. 16, 2003

(30) Foreign Application Priority Data

Apr. 12, 2002 (JP) .......................................... 2002-111118

(51) Int. Cl.⁷ ................................................. H05K 7/16
(52) U.S. Cl. ......................... 361/681; 348/372; 16/342; 312/223.3
(58) Field of Search .............................. 361/679–682, 361/724–727; 348/372–375; 16/342–343; 312/223.1–223.6

(56) References Cited

U.S. PATENT DOCUMENTS 5,790,193 A * 8/1998 Ohmori ....................... 348/375
6,353,529 B1 * 3/2002 Cies ............................ 361/681
6,587,151 B1 * 7/2003 Cipolla et al. .............. 348/373

OTHER PUBLICATIONS

Pending U.S. Appl. No. 10/404,054.*

* cited by examiner

Primary Examiner—Hung Van Duong
(74) Attorney, Agent, or Firm—Greenblum & Bernstein, P.L.C.

(57) ABSTRACT

A guiding structure which guides a flexible printed wiring board through a hinge portion between a body member and a swingable member hinged on the body member via a pivot, the guiding structure includes a flexible-PWB fixing portion formed on the swingable member to be coaxial with the pivot, and a flexible-PWB insertion portion formed on the body member to be coaxial with the pivot and to be rotatable relative to the flexible-PWB fixing portion. One end of the flexible printed wiring board is positioned inside the swingable member. An intermediate portion of the flexible printed wiring board is drawn into the body member through the flexible-PWB insertion portion after a portion of the intermediate portion is fixed to the flexible-PWB fixing portion. Another end of the flexible printed wiring board is connected to a connector provided inside the body member.

12 Claims, 15 Drawing Sheets

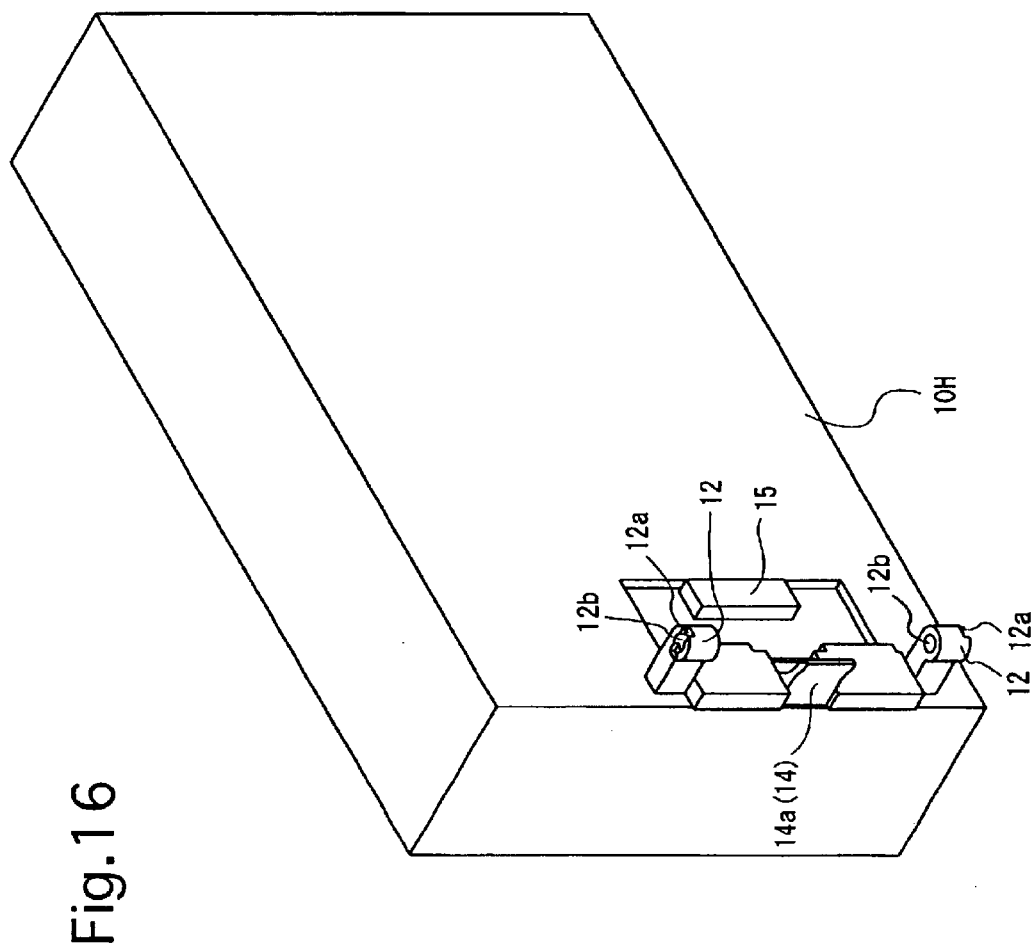

STRUCTURE FOR GUIDING FLEXIBLE PRINTED WIRING BOARD THROUGH A HINGE PORTION BETWEEN A BODY AND A SWINGABLE MEMBER

BACKGROUND OF THE INVENTION

1. Field of the Invention

The present invention relates to a structure which guides a flexible PWB (printed wiring board) through a hinge portion between a body, e.g. a body of a digital camera or a camcorder, and a swingable member, e.g. a flat-panel display, which is hinged on the body.

2. Description of the Related Art

In an electronic device having an opening-and-closing mechanism using a hinge structure for swingably mounting a swingable member relative to a body of the electronic device, one or more lead wires (electrically conductive lead wires) are generally used when electrical signals need to be communicated between the body and the swingable member. A similar electronic device using a flexible PWB instead the lead wires is also known in the art. This conventional device using a flexible PWB is designed based on the technical concept that sufficient play is given between the flexible PWB and a hinge portion formed between the body and the swingable member so that the flexible PWB does not interfere with the swinging operation of the swingable member.

SUMMARY OF THE INVENTION

The present invention provides a structure for guiding a flexible PWB through a hinge portion between a body and a swingable member hinged on the body, wherein the guiding structure has little play between the flexible PWB and a hinge portion formed between the body and the swingable member without the flexible PWB being exposed to the outside of the hinge portion.

According to an aspect of the present invention, a guiding structure is provided which guides a flexible printed wiring board through a hinge portion between a body member and a swingable member hinged on the body member via a pivot, the guiding structure including a flexible-PWB fixing portion formed on the swingable member to be coaxial with the pivot, and a flexible-PWB insertion portion formed on the body member to be coaxial with the pivot and to be rotatable relative to the flexible-PWB fixing portion. One end of the flexible printed wiring board is positioned inside the swingable member. An intermediate portion of the flexible printed wiring board is drawn into the body member through the flexible-PWB insertion portion after a portion of the intermediate portion is fixed to the flexible-PWB fixing portion. Another end of the flexible printed wiring board is connected to a connector provided inside the body member.

The flexible printed wiring board can include at least one bending portion, positioned inside the body member between the connector and the flexible-PWB fixing portion, for absorbing a movement of the flexible printed wiring board when the body member and the swingable member rotate relative to each other.

The pivot can include a pair of pivot pins, the flexible-PWB fixing portion being positioned between the pair of pivot pins.

It is desirable for the flexible printed wiring board to include a wide-width portion and a narrow-width portion which extend between the swingable member and the flexible-PWB insertion portion via the flexible-PWB fixing portion. The wide-width portion is fixed to the flexible-PWB fixing portion and the narrow-width portion passes through the flexible-PWB insertion portion.

It is desirable for the wide-width portion to include a hole through which at least a portion of the flexible-PWB insertion portion passes the wide-width portion.

It is desirable for the flexible-PWB fixing portion to include a pair of cylindrical halves formed on a casing of the swingable member and a cover member of the swingable member, respectively, the cover member being fixed to the casing.

It is desirable for the flexible-PWB insertion portion to include a pair of cylindrical halves formed on a casing of the body member and a cover member of the body member, respectively, the cover member being fixed to the casing.

It is desirable for the casing of the swingable member and the cover member of the swingable member to include a first bending/guiding portion and a second bending/guiding portion which are in contact with two sides of the flexible printed wiring board to define a bending portion thereof, respectively. The first bending/guiding portion and the second bending/guiding portion are different from each other in shape and location to bend the flexible printed wiring board at different positions thereon when the swingable member and the body member rotate relative to each other.

The body member can serves as a body of a digital camera and the swingable member can serves as a display member of the digital camera.

The hinge portion can include a first knuckle formed on the body member, a second knuckle formed on the swingable member and positioned to be coaxial with the first knuckle, and a pivot extending through the first knuckle and the second knuckle to join the first knuckle and the second knuckle to each other. The flexible-PWB fixing portion is integrally formed with the second knuckle.

The swingable member can include a display panel to which the one end of the flexible printed wiring board is fixed.

In another embodiment, a camera having a camera body and a swingable component hinged on the camera body is provided, including a hinge structure having a first knuckle fixed to the camera body and a second knuckle fixed to the swingable component coaxial with the first knuckle, a pivot extending through the first knuckle and the second knuckle to join the first knuckle and the second knuckle to each other, a flexible printed wiring board extending between the camera body and the swingable component, a flexible-PWB fixing portion formed on the swingable component to be coaxial with the pivot, and a flexible-PWB insertion portion formed on the camera body to be coaxial with the pivot and to be rotatable relative to the flexible-PWB fixing portion. One end of the flexible printed wiring board is positioned inside the swingable component. An intermediate portion of the flexible printed wiring board is drawn into the camera body through the flexible-PWB insertion portion after a portion of the intermediate portion is fixed to the flexible-PWB fixing portion. Another end of the flexible printed wiring board is connected to a connector provided in the camera body.

The present disclosure relates to subject matter contained in Japanese Patent Application No. 2002-111118 (filed on Apr. 12, 2002) which is expressly incorporated herein by reference in its entirety.

BRIEF DESCRIPTION OF THE DRAWINGS

The present invention will be described below in detail with reference to the accompanying drawings in which:

FIG. 16 is a perspective view of the camera body of the digital camera shown in FIGS. 3 and 4 with the display member and the cover member of the camera body being removed;

DESCRIPTION OF THE PREFERRED EMBODIMENT

Figure 1:
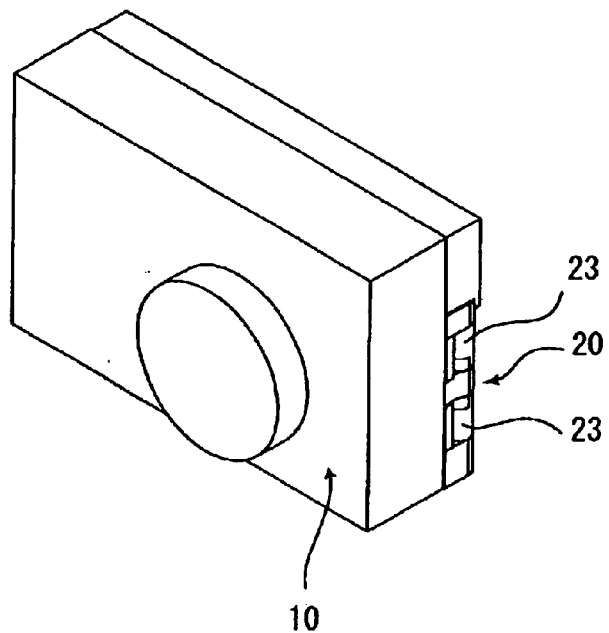
FIG. 1 is a front perspective view of an embodiment of a digital camera which incorporates a structure guiding a flexible PWB through a hinge portion to which the prevent invention is applied.
Figure 2:
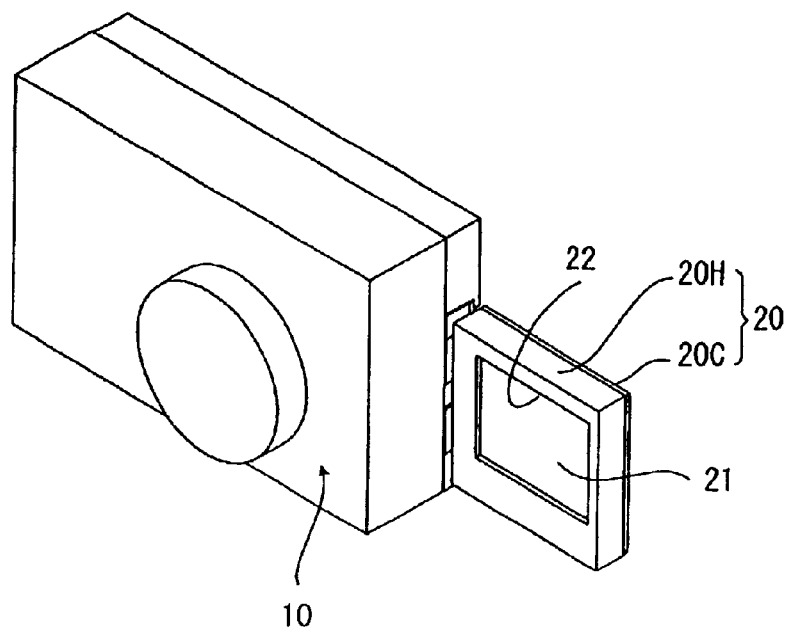
FIG. 2 is a view similar to that of FIG. 1 and illustrates the digital camera with a swingable display member being fully open.
Figure 3:
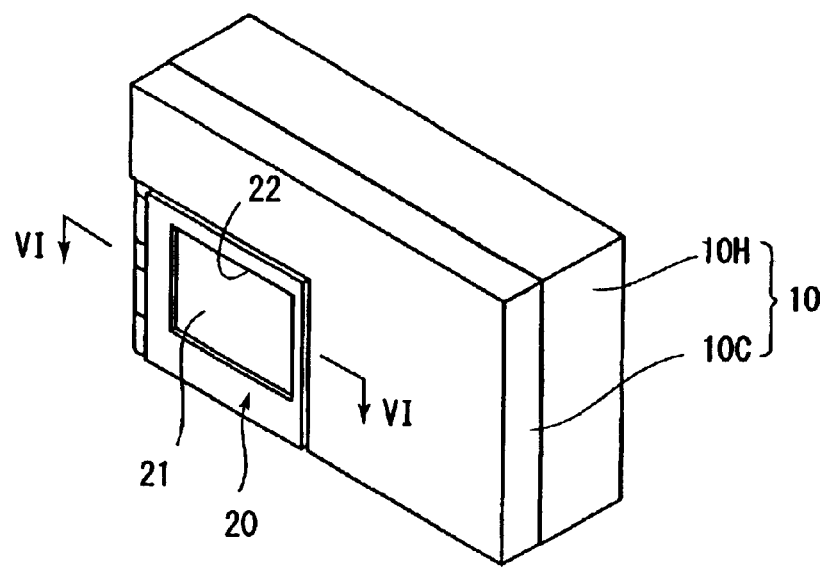
FIG. 3 is a rear perspective view of the digital camera shown in FIG. 1.
Figure 4:
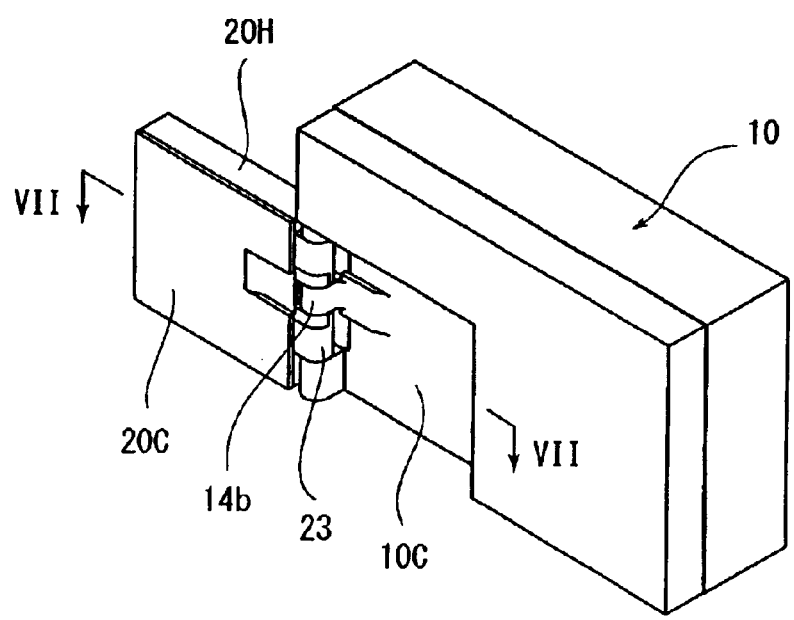
FIG. 4 is a rear perspective view of the digital camera shown in FIG. 2.

FIGS. 1 through 4 show an embodiment of a digital camera having a hinge portion between a camera body 10 and a flat-panel display member (swingable member) 20 hinged on the camera body (body member) 10, according to the present invention. Although one of the camera body 10 and the display member 20 is swingable relative to the other, the camera body 10 and the display member 20 are hereinafter referred to as a body member 10 and a swingable member 20, respectively, for the sake of expediency. The body member 10 is provided with a pair of exterior members: a body casing 10H and a body cover member 10C fixed to the body casing 10H. Likewise, the swingable member 20 is provided with a pair of exterior members: a swingable casing 20H and a swingable cover member 20C fixed to the swingable casing 20H.

The swingable member 20 is provided between the swingable casing 20H and the swingable cover member 20C with an LCD panel 21. The swingable casing 20H is provided with a rectangular opening 22 through which the LCD panel 21 is exposed to the outside of the swingable member 20. As shown in FIGS. 12 through 15, the swingable casing 20H is provided with a pair of first knuckles (upper and lower knuckles) 23 which are integrally formed with the swingable casing 20H. The pair of first knuckles 23 extend horizontally from a vertical side wall of the swingable casing 20H with a vertical gap therebetween so that the respective axes are coaxially arranged.

As clearly shown in FIG. 16, the body casing 10H of the body member 10 is provided with a second pair of knuckles (upper and lower knuckles) 12 which are integrally formed with the body casing 10H. The pair of second knuckles 12 extend horizontally from a rear wall of the body casing 10H with a vertical gap therebetween so that the respective axes are coaxially arranged. The upper knuckle 12 is positioned immediately above the upper knuckle 23 while the lower knuckle 12 is positioned immediately below the lower knuckle 23. In a state where the swingable member 20 is correctly hinged on the body member 10, the pair of first knuckles 23 and the pair of second knuckles 12 are coaxially arranged. The upper knuckle of the pair of first knuckles 23 and the upper knuckle of the pair of second knuckles 12, i.e. an upper pair of knuckles, are hinged with a pivot pin (upper pivot pin) 30 which is inserted into respective axial holes of the two upper knuckles from above the upper knuckle of the pair of second knuckles 12. Likewise, the lower knuckle of the pair of first knuckles 23 and the lower knuckle of the pair of second knuckles 12, i.e. a lower pair of knuckles, are hinged with another pivot pin (lower pivot pin) 30 which is inserted into respective axial holes of the two lower knuckles from below the lower knuckle of the pair of second knuckles 12. The upper pair of knuckles 12 and 23 that are joined to each other by the upper pivot pin 30 and the lower pair of knuckles 12 and 23 that are joined to each other by the lower pivot pin 30 are symmetrically arranged with respect to a horizontal plane extending through a center point therebetween.

Figure 12:
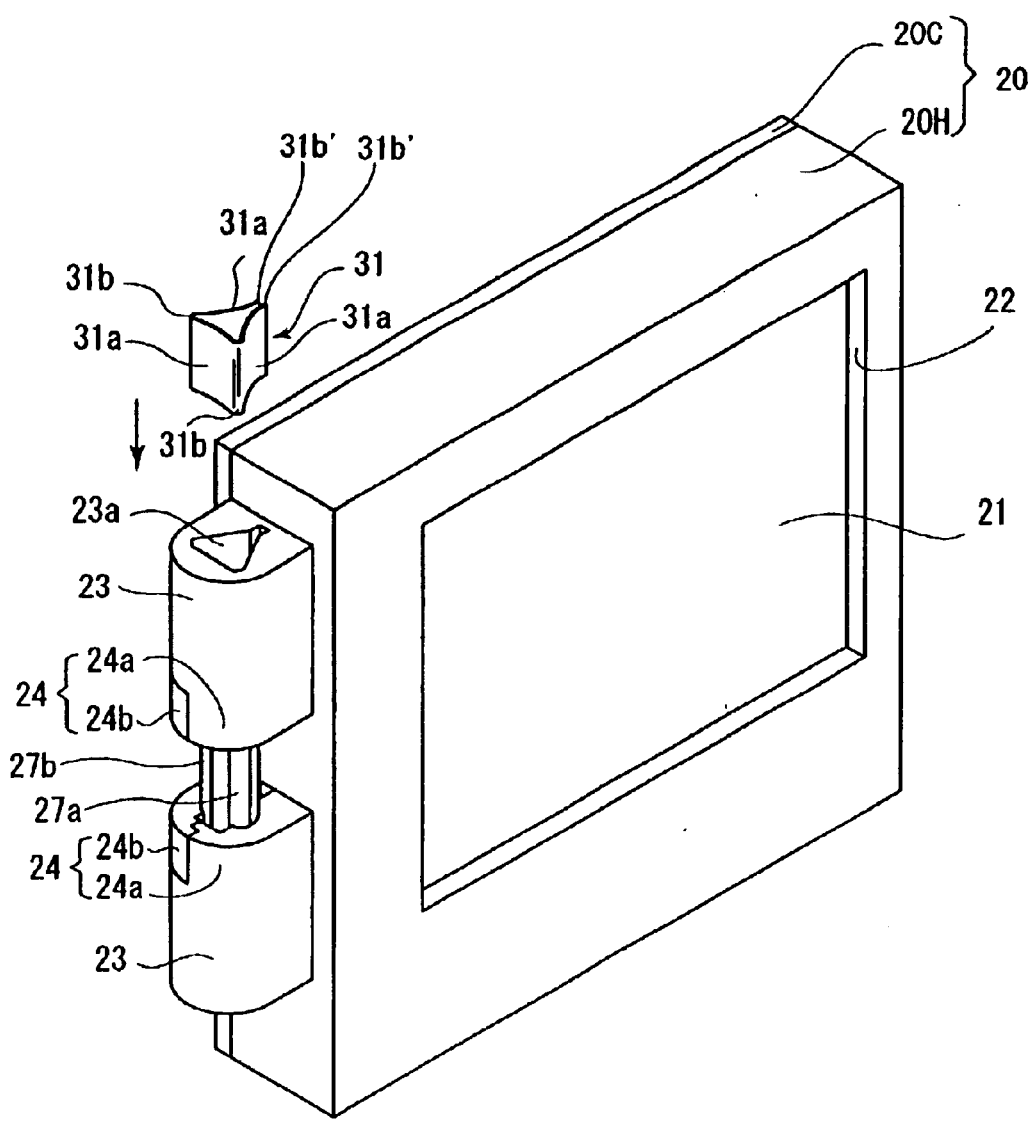
FIG. 12 is a perspective view of the display member and a frictional member which are components of the digital camera shown in FIGS. 1 through 4.
Figure 13:
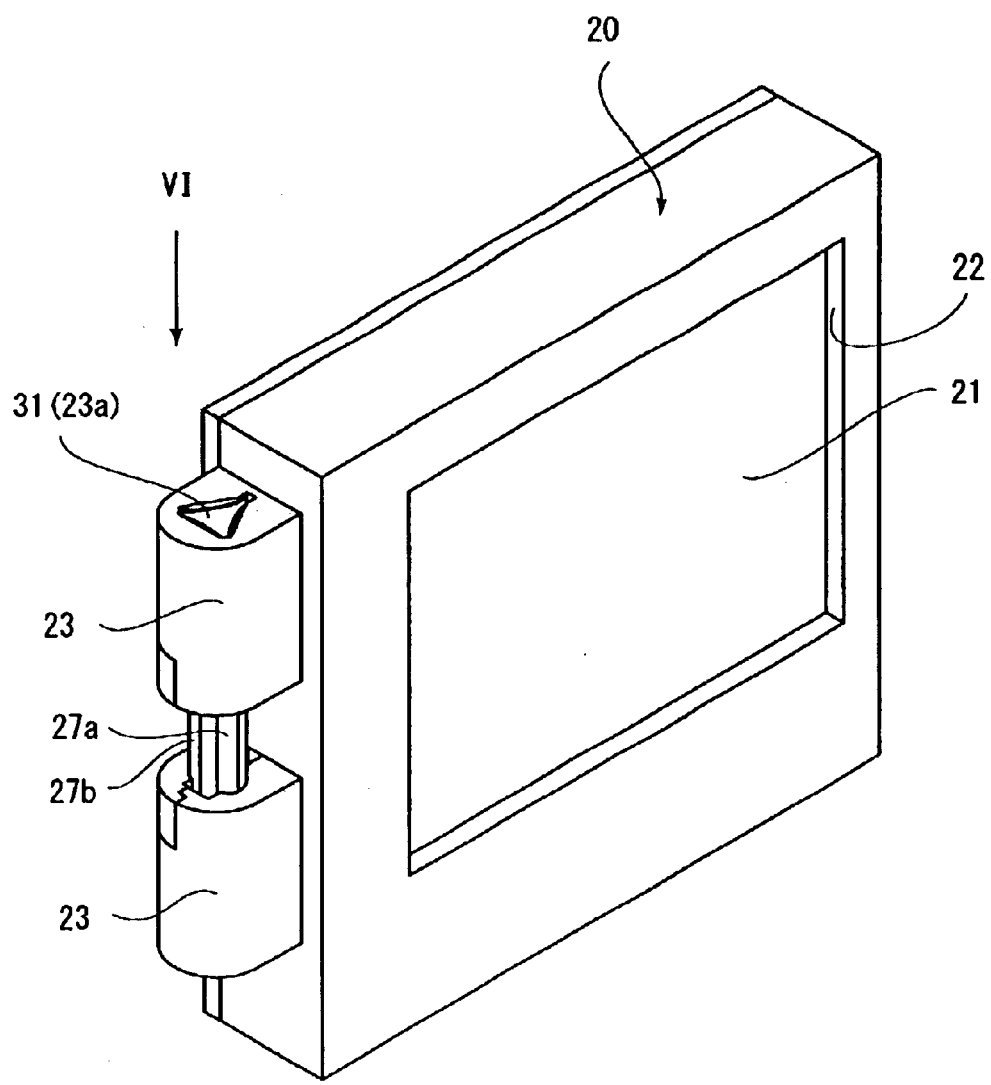
FIG. 13 is a perspective view of the display member and the frictional member shown in FIG. 12 with the frictional member fitted into an upper knuckle portion of the display member.
Figure 14:
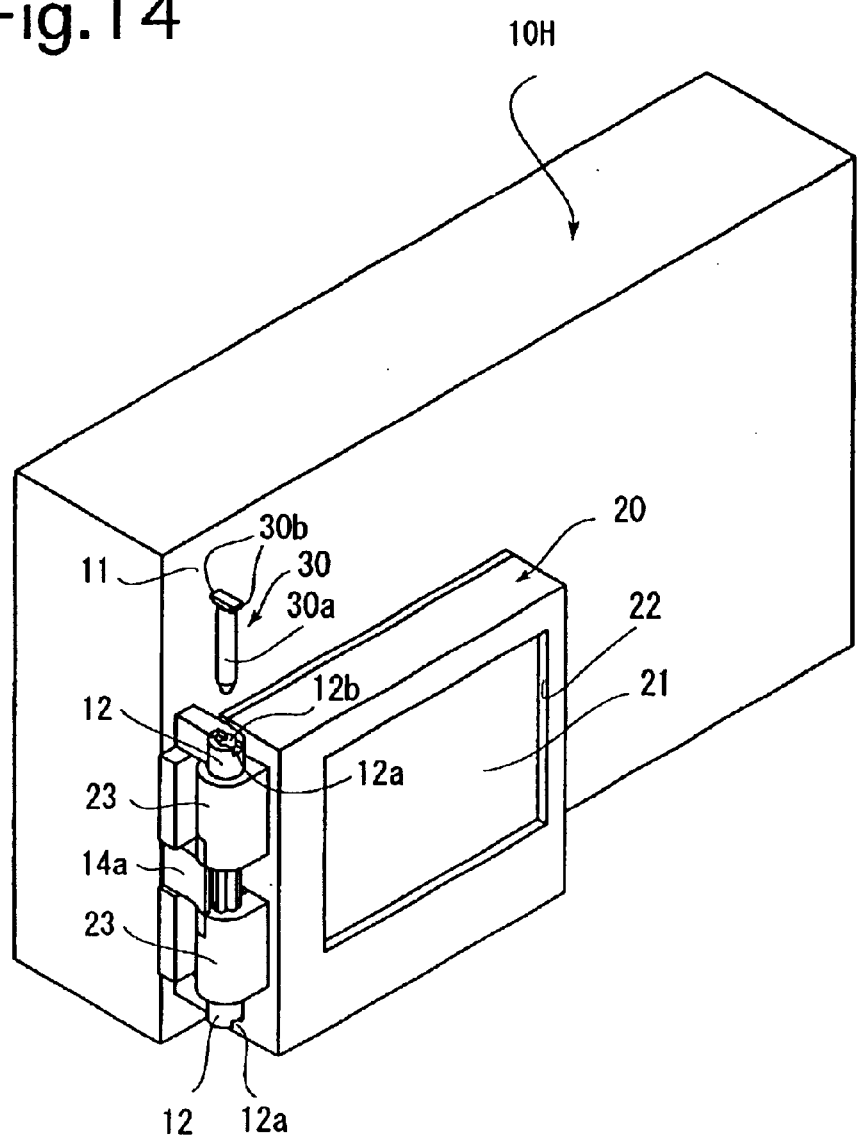
FIG. 14 is a perspective view of the digital camera shown in FIGS. 1 through 4, showing a state where a pivot pin, serving as an element of the structure of the hinge portion of the digital camera, is removed.
Figure 15:
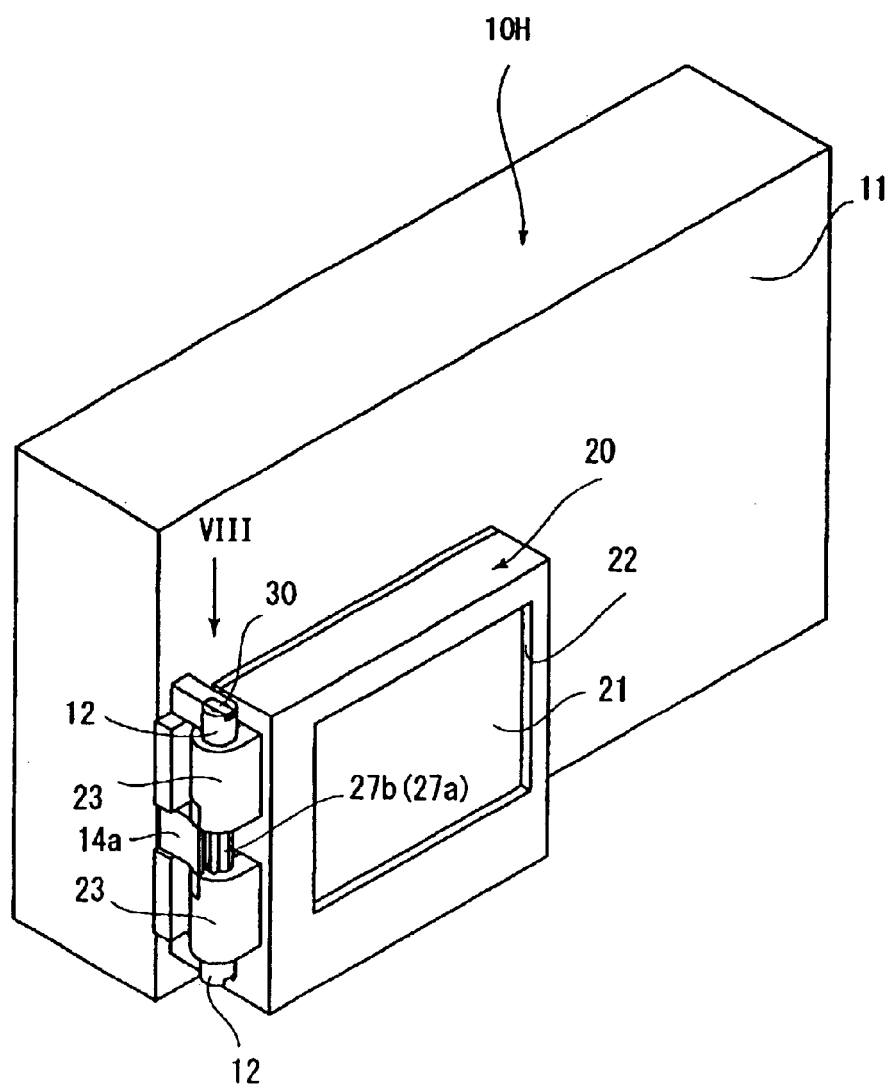
FIG. 15 is a view similar to that of FIG. 14 and illustrates a state where the display member is hinged on a casing of the camera body with the pivot pin.

As shown in FIGS. 12 and 13, a frictional member 31 is fitted into an axial hole 23a of each knuckle 23 of the swingable member 20 before the upper and lower pivot pins 30 are inserted into the axial holes 23a of the pair of first knuckles 23, respectively. The lower frictional member 31, which is fitted into the axial hole 23a of the lower knuckle 23 of the swingable member 20, is not shown in FIGS. 12 and 13. Each frictional member 31 is made of a metal leaf spring which is bent to have the shape of a substantially hollow triangular tube. More specifically, each of three side walls 31a constituting the metal leaf spring of each frictional member 31 is slightly curved inwards so as to come into pressing contact with a cylindrical shaft portion 30a (see FIG. 14) of the associated pivot pin 30 when the cylindrical shaft portion 30a is inserted into the frictional member 31. The axial hole 23a of each knuckle 23 has a substantially triangular cross section corresponding to the shape of each frictional member 31. This structure prevents each frictional member 31 from rotating in the axial hole 23a of the associated knuckle 23. At the same time, when each of the three side walls 31a of each frictional member 31 is resiliently deformed by an insertion of the shaft portion 30a of the associated pivot pin 30 into the frictional member 31, two parallel ridges 31b and two parallel edges 31b' are firmly pressed against an inner surface of the knuckle 23 in the axial hole 23a with substantially no play between the frictional member 31 and the inner surface of the knuckle 23. On the other hand, as shown in FIG. 14, each knuckle 12 of the body member 10 has an axial hole 12b into which the shaft portion 30a of the associated pivot pin 30 is inserted. The axial hole 12b of each knuckle 12 has a circular cross section, the diameter of which is substantially identical to the diameter of the shaft portion 30a of each pivot pin 30.

Each pivot pin 30 is provided at an end of the shaft portion 30a with a set of two radial projections 30b extending radially outwards in opposite directions (see FIG. 14). Each knuckle 12 of the body member 10 is provided with a set of two stop grooves 12a into which the set of two radial projections 30b of the associated pivot pin 30 are fitted, respectively, when the shaft portion 30a of the pivot pin 30 is inserted into the axial hole 12a.

The swingable member 20 is provided between the pair of first knuckles 23 with a pair of flexible-PWB fixing portions 24 (see FIG. 12), while the body member 10 is provided between the pair of flexible-PWB fixing portions 24 with a flexible-PWB insertion portion 14 (see FIGS. 6, 7, 14 and 15). The pair of flexible-PWB fixing portions 24 is substantially coaxial with the pair of first knuckles 23, and each flexible-PWB fixing portion 24 consists of a pair of cylindrical halves 24a and 24b integrally formed with the associated knuckle 23 and the swingable cover member 20C, respectively. Between the cylindrical halves 24a and 24b is formed an axial space, i.e., each flexible-PWB fixing portion 24 is hollow. Each of the respective ends of the cylindrical halves 24a and 24b of each flexible-PWB fixing portion 24, which are engaged with each other when the swingable cover member 20C and the swingable casing 20H are properly fixed to each other, is formed as an engaging stepped portion 24c so that the ends of the cylindrical halves 24a and 24b can be securely engaged with each other. The pair of flexible-PWB fixing portions 24 and the flexible-PWB insertion portion 14 constitute a guiding structure.

Figure 5:
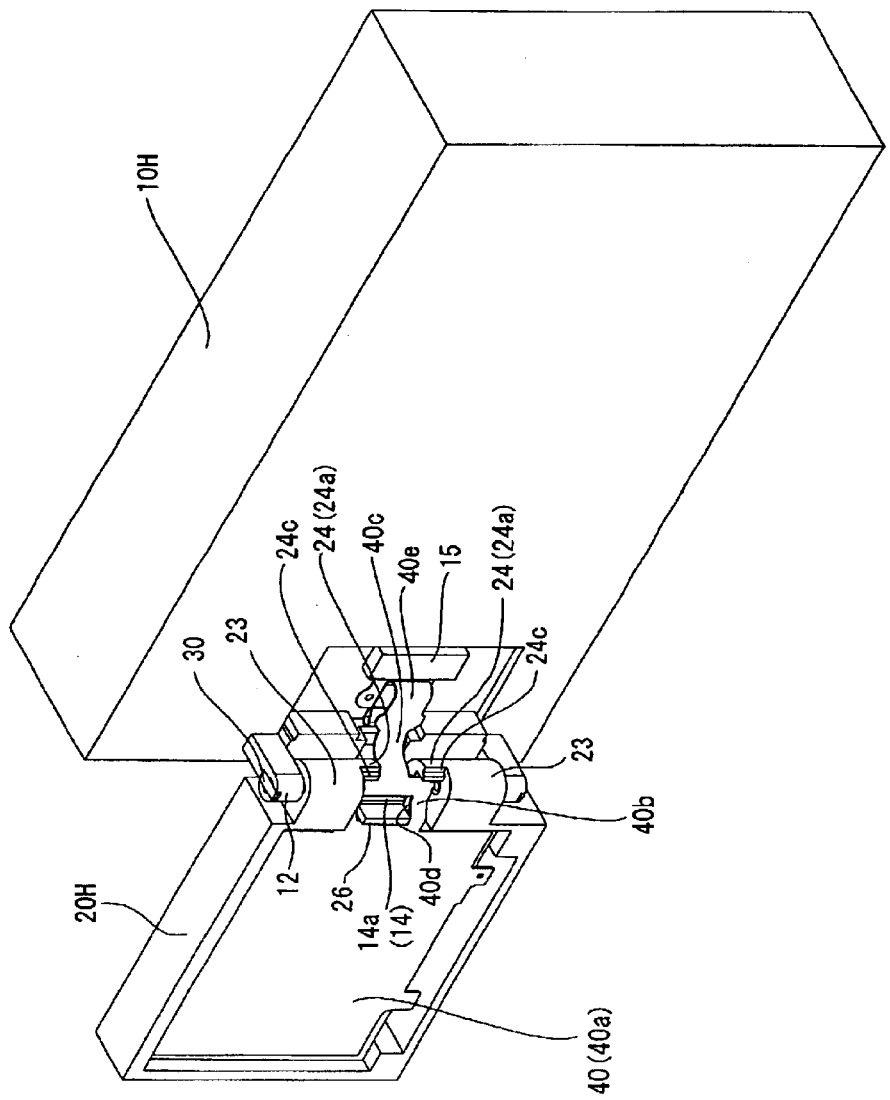
FIG. 5 is a view similar to that of FIG. 4 and illustrates the digital camera in a state where a cover member of the display member and a cover member of the camera body are removed.
Figure 9:
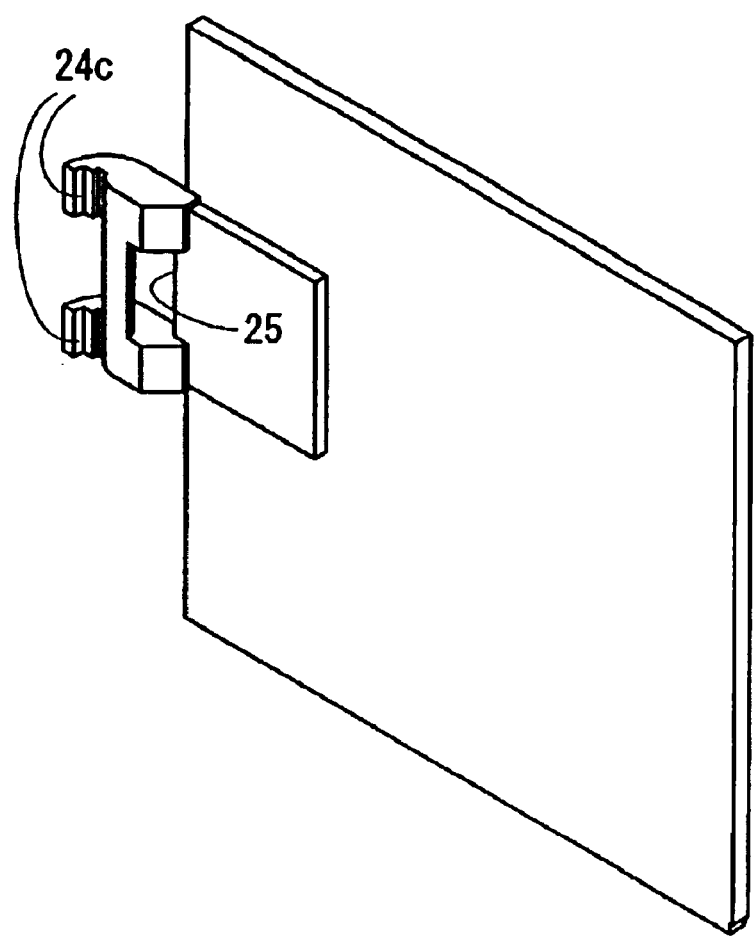
FIG. 9 is a perspective view of the cover member shown in FIG. 8, viewed from a different angle.
Figure 10:
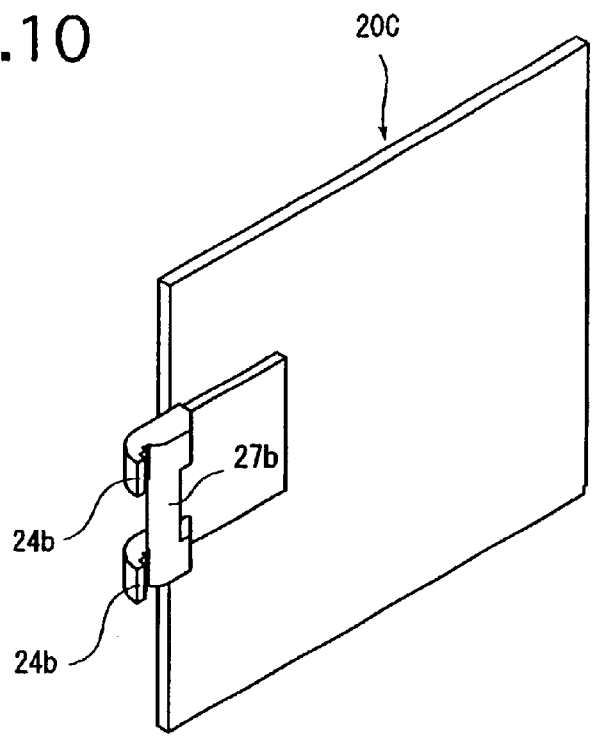
FIG. 10 is a perspective view of the cover member shown in FIG. 8, viewed from a different angle.
Figure 11:
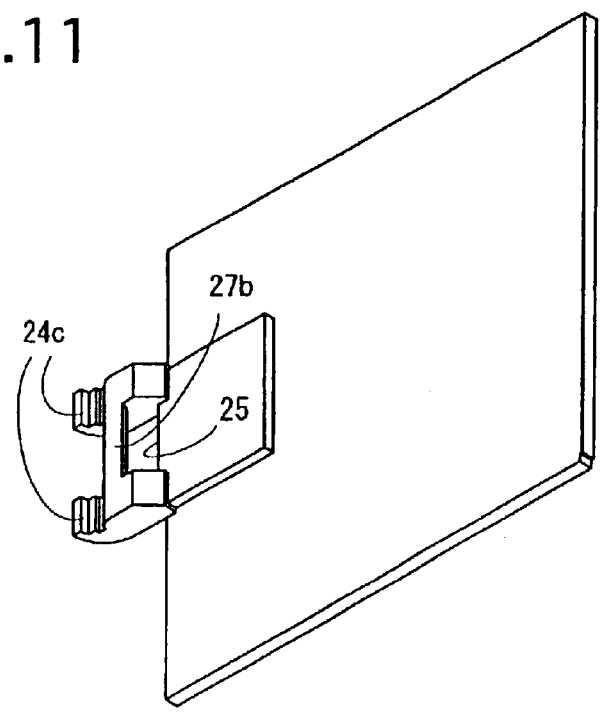
FIG. 11 is a perspective view of the cover member shown in FIG. 8, viewed from a different angle.

On the other hand, the flexible-PWB insertion portion 14 of the body member 10 is substantially coaxial with the pair of second knuckles 12, and consists of a pair of cylindrical halves 14a and 14b formed integral with the body casing 10H and the body cover member 10C, respectively. Between the cylindrical halves 14a and 14b is formed an axial space, i.e., the flexible-PWB insertion portion 14 is hollow. In FIGS. 5 and 16, the cylindrical half portion 14a appears as a protrusion. The swingable cover member 20C is provided with an opening 25 (see FIGS. 9 and 11) into which the half portion 14b of the body cover member 10C is allowed to enter. Each of the respective ends of the cylindrical halves 14a and 14b of the flexible-PWB insertion portion 14, which are engaged with each other when the body cover member 10C and the body casing 10H are correctly fixed to each other, is formed as an engaging stepped portion 14c so that the ends of the cylindrical halves 14a and 14b can be securely engaged with each other.

Figure 6:
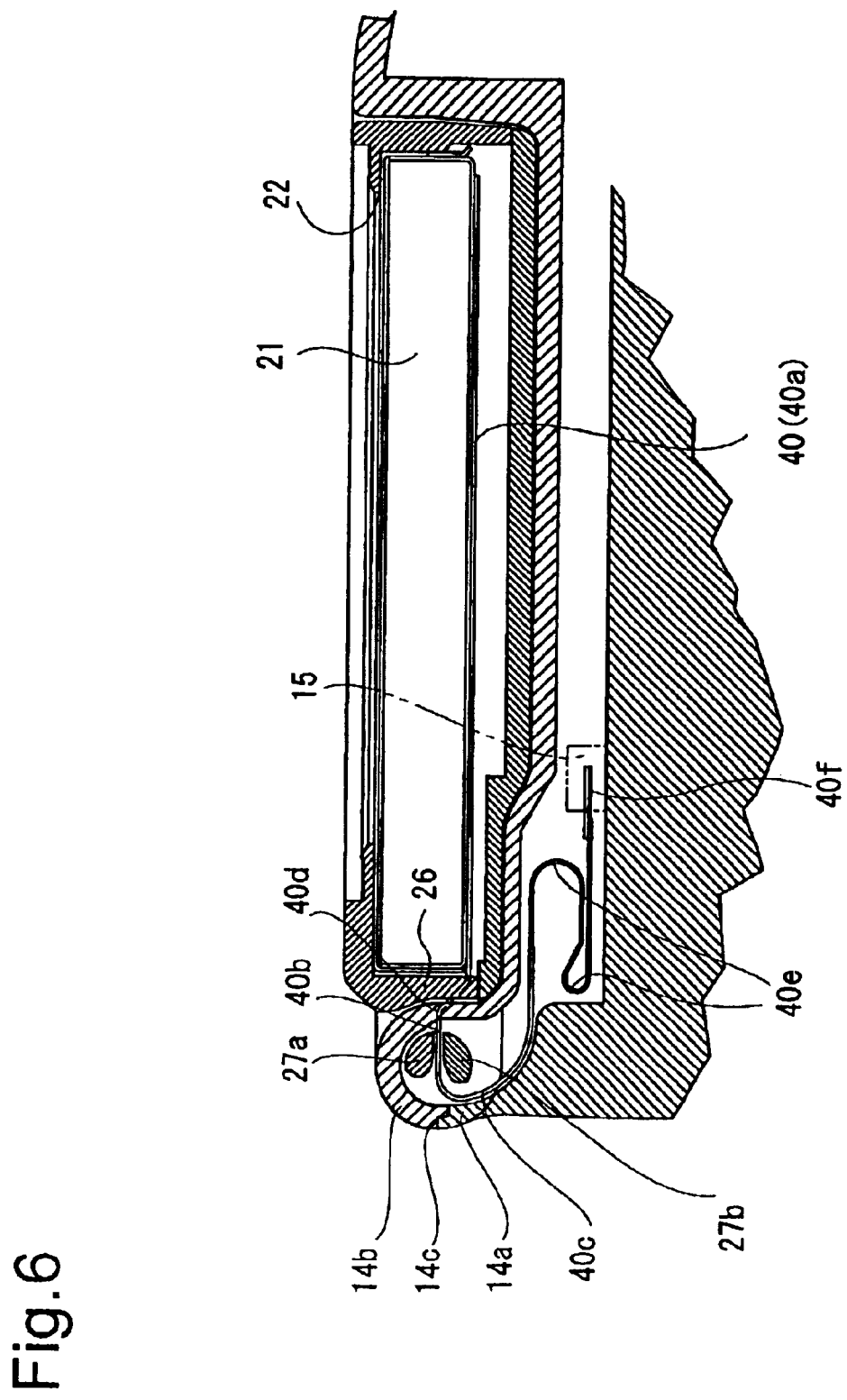
FIG. 6 is a cross sectional view taken along VI—VI line shown in FIG. 3.
Figure 7:
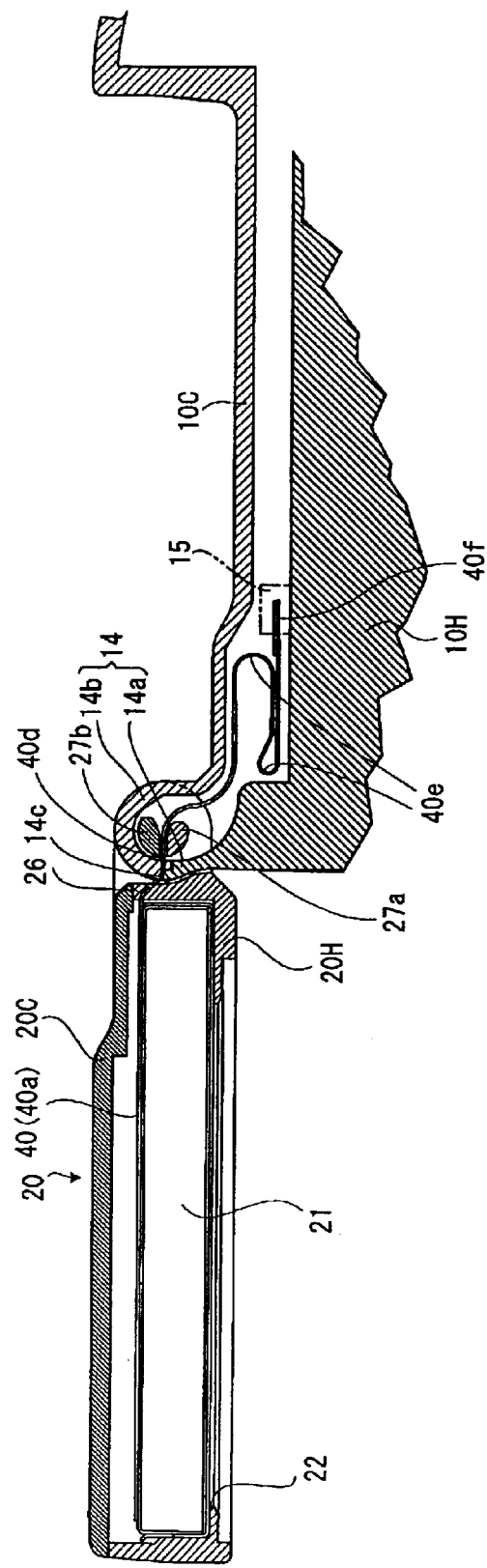
FIG. 7 is a cross sectional view taken along VII—VII line shown in FIG. 4.
Figure 8:
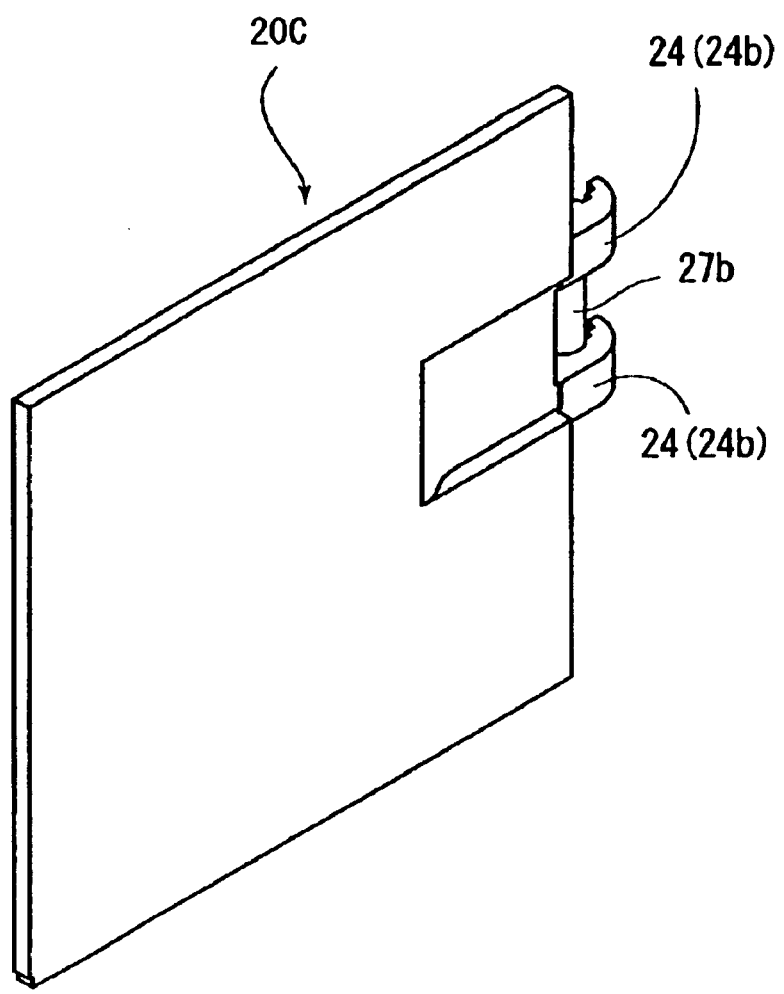
FIG. 8 is a perspective view of the cover member of the display member.
Figure 18:
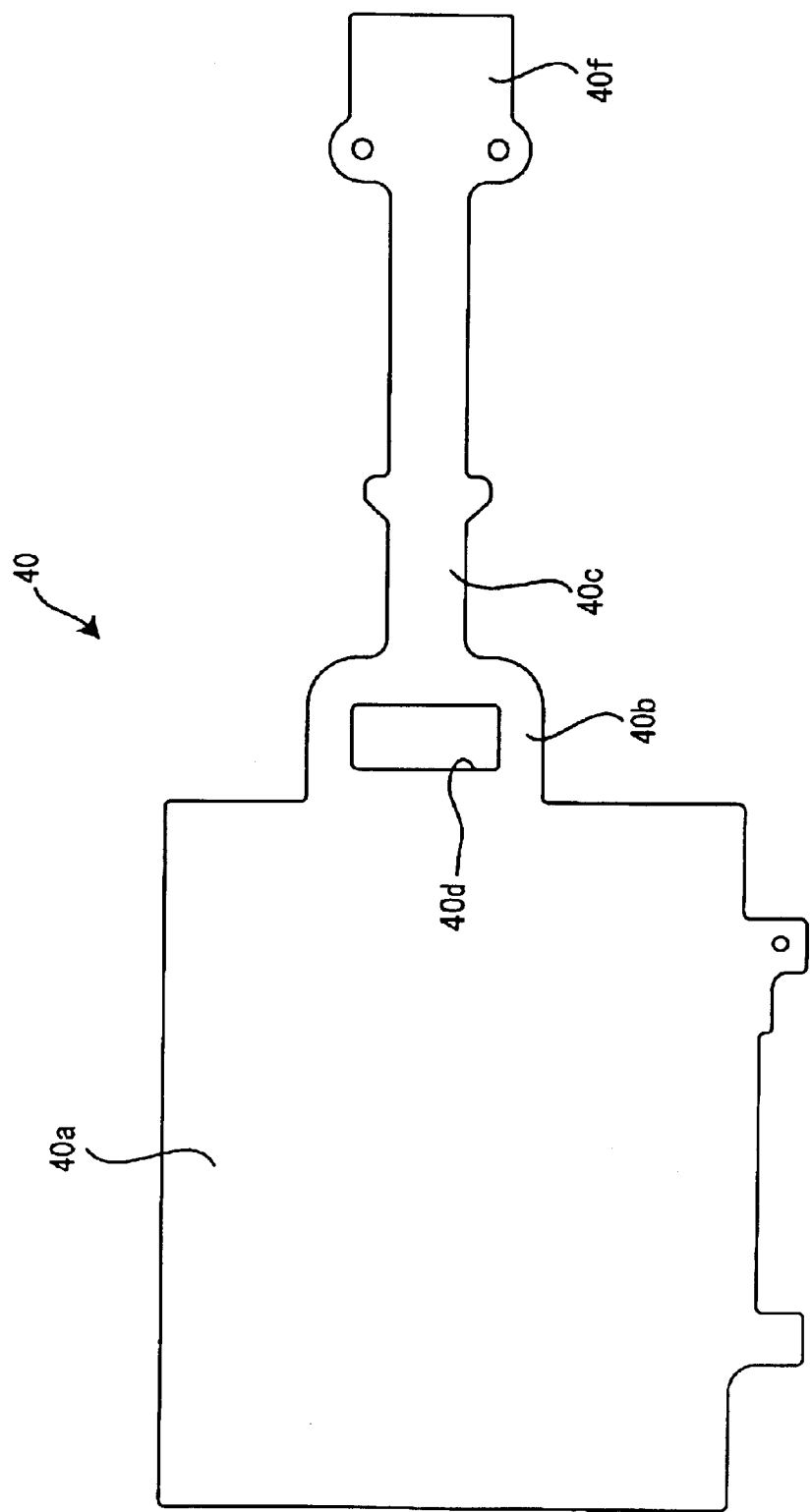
FIG. 18 is a plan view of the flexible PWB.

As shown in FIGS. 5, 6 and 7, the present embodiment of the digital camera is provided with a flexible PWB (flexible printed wiring board) 40. As shown in FIGS. 5 and 18, the flexible PWB 40 is provided at one end thereof with a substantially rectangular flat portion 40a which lies on a rear surface of the LCD panel 21 that is positioned in the swingable member 20, and is further provided with a wide-width portion 40b and a narrow-width portion 40c. The wide-width portion 40b extends from an edge of the flat portion 40a to be positioned in the pair of flexible-PWB fixing portions 24, while the narrow-width portion 40c extends from the wide-width portion 40b to be positioned in the flexible-PWB insertion portion 14. The wide-width portion 40b is provided with a rectangular clearance hole 40d through which the cylindrical half 14a of the body casing 10H and a deviation prevention projection 26 projecting from the swingable casing 20H pass. The narrow-width portion 40c is drawn into the body member 10 so that the end of the narrow-width portion 40c, i.e. the other end 40f (see FIGS. 6 and 7) of the flexible PWB 40, is connected to a connector 15 provided in the body member 10. The narrow-width portion 40c is bent twice to form two bending portions 40e (see FIGS. 5 through 7) in the body member 10.

Figure 17A:
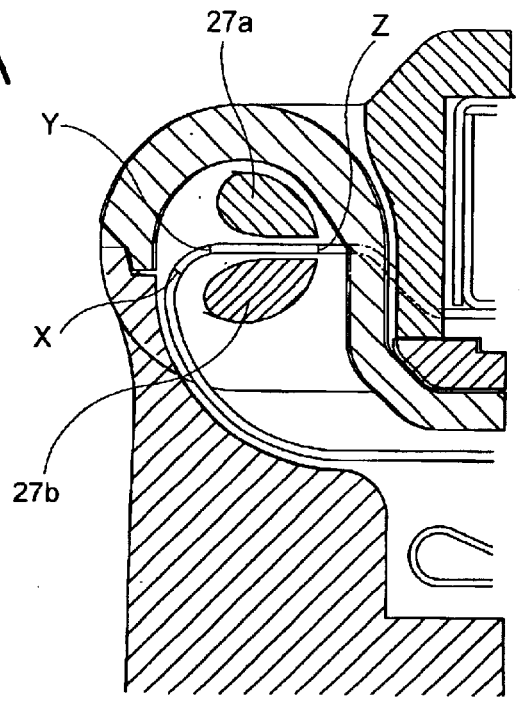
FIG. 17A is a cross sectional view of a fundamental portion of the hinge portion of the digital camera shown in FIGS. 1 through 4, showing a shape of the flexible PWB shown in FIG. 6 when the display member is in the fully-open position.
Figure 17B:
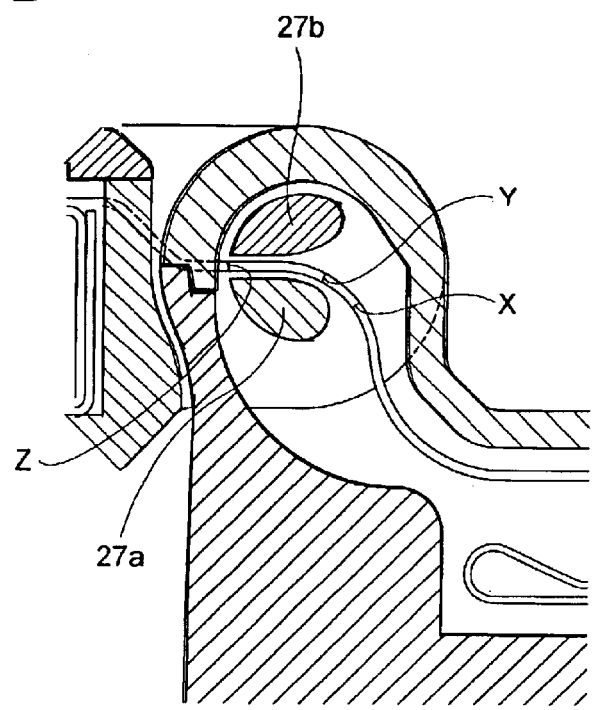
FIG. 17B is a view similar to that of FIG. 17A, showing a shape of the flexible PWB shown in FIG. 7 when the display member is in the fully-close position.

The swingable casing 20H and the swingable cover member 20C are provided with a bending/guiding portion 27a and a bending/guiding portion 27b which are in contact with front and rear surfaces of the wide-width portion 40b of the flexible PWB 40, respectively, to define a bending portion of the flexible PWB 40 when the body member 10 and the swingable member 20 rotate relative to each other (see FIGS. 6 and 7). As shown in FIGS. 17A and 17B, the two bending/guiding portions 27a and 27b are different from each other in shape and location to bend the flexible PWB 40 (specifically, the narrow-width portion 40c) at different positions X and Y thereon when the body member 10 and the swingable member 20 rotate relative to each other. In FIGS. 17A and 17B, "Z" designates a fixed point (reference point) which does not move relative to the swingable member 20, and the positions X and Y are at predetermined positions from the fixed point Z.

In the above described flexible-PWB guiding structure which guides the flexible PWB 40 through the hinge portion between the body member 10 and the swingable member 20, the flat portion 40a of the flexible PWB 40 together with the LCD panel 21 is accommodated in the swingable casing 20H, and at the same time, the wide-width portion 40b is placed between the pair of first knuckles 23 with the cylindrical half 14a of the body cover member 10C and the deviation prevention projection 26 of the swingable casing 20H penetrating the wide-width portion 40b through the clearance hole 40d of the wide-width portion 40b. Moreover, the narrow-width portion 40c is drawn into the body member 10 via the flexible-PWB insertion portion 14. Furthermore, the end 40f of the narrow-width portion 40c is connected to the connector 15 after the narrow-width portion 40c is bent twice to form the two bending portions 40e in the body member 10.

After the narrow-width portion 40c is connected to the connector 15 at the end 40f, the swingable cover member 20C is fixed to the swingable casing 20H so that the engaging stepped portions 24c of the cylindrical halves 24a and 24b are engaged with each other to complete the pair of flexible-PWB fixing portions 24. At this stage, the operation of fixing the flexible PWB 40 to the digital camera is substantially complete. Thereafter, the body cover member 10C is fixed to the body casing 10H so that the half portion 14b of the body cover member 10C is engaged with the half portion 14a of the body casing 10H via the opening 25. This completes the flexible-PWB insertion portion 14.

According to the present embodiment of the digital camera assembled in the above described manner, the wide-width portion 40b of the flexible PWB 40 (the rectangular flat portion 40a of the flexible PWB 40 being positioned within the swingable member 20) is substantially fixed to the pair of flexible-PWB fixing portions 24 while the narrow-width portion 40c of the flexible PWB 40 is drawn into the body member 10 via the flexible-PWB insertion portion 14 in the hinge portion formed between the body member 10 and the swingable member 20. Moreover, a movement of the flexible PWB 40 which is caused by a rotational movement of one of the body member 10 and the swingable member 20 relative to the other is absorbed by the bending portions 40e of the narrow-width portion 40c of the flexible PWB 40 since the bending portions 40e are inside the body member 10. The bending/guiding portion 27a and the bending/guiding portion 27b prevent the flexible PWB 40 from breakage caused by repeated bending of the flexible PWB 40 at the same portion thereof since the bending/guiding portion 27a and the bending/guiding portion 27b change the bending position on the flexible PWB 40 (specifically, the narrow-width portion 40c thereof) between two different states where the swingable member 20 is open and closed, respectively. Furthermore, the flexible PWB 40 is not exposed to the outside of the digital camera through the flexible-PWB insertion portion 14 and the pair of flexible-PWB fixing portions 24, which gives a high quality appearance to the digital camera.

As can be understood from the above description, a guiding structure guiding a flexible PWB through a hinge portion between a body and a swingable member hinged on the body is achieved, wherein the guiding structure has little play between the flexible PWB and a hinge portion formed between the body and the swingable member without the flexible PWB being exposed to the outside of the hinge portion.

Obvious changes may be made in the specific embodiment of the present invention described herein, such modifications being within the spirit and scope of the invention claimed. It is indicated that all matter contained herein is illustrative and does not limit the scope of the present invention.

What is claimed is:

1. A guiding structure which guides a flexible printed wiring board through a hinge portion between a body member and a swingable member hinged on said body member via a pivot, said guiding structure comprising:
    a flexible-PWB fixing portion formed on said swingable member to be coaxial with said pivot; and
    a flexible-PWB insertion portion formed on said body member to be coaxial with said pivot and to be rotatable relative to said flexible-PWB fixing portion;
    wherein one end of said flexible printed wiring board is positioned inside said swingable member;
    wherein an intermediate portion of said flexible printed wiring board is drawn into said body member through said flexible-PWB insertion portion after a portion of said intermediate portion is fixed to said flexible-PWB fixing portion; and
    wherein another end of said flexible printed wiring board is connected to a connector provided inside said body member.

2. The guiding structure according to claim 1, wherein said flexible printed wiring board comprises at least one bending portion, positioned inside said body member between said connector and said flexible-PWB fixing portion, for absorbing a movement of said flexible printed wiring board when said body member and said swingable member rotate relative to each other.

3. The guiding structure according to claim 1, wherein said pivot comprises a pair of pivot pins, said flexible-PWB fixing portion being positioned between said pair of pivot pins.

4. The guiding structure according to claim 1, wherein said flexible printed wiring board comprises a wide-width portion and a narrow-width portion which extend between said swingable member and said flexible-PWB insertion portion via said flexible-PWB fixing portion;
    wherein said wide-width portion is fixed to said flexible-PWB fixing portion; and
    wherein said narrow-width portion passes through said flexible-PWB insertion portion.

5. The guiding structure according to claim 1, wherein said flexible-PWB insertion portion comprises:
    a pair of cylindrical halves formed on a casing of said body member and a cover member of said body member, respectively, said cover member being fixed to said casing.

6. The guiding structure according to claim 1, wherein said body member serves as a body of a digital camera; and
    wherein said swingable member serves as a display member of said digital camera.

7. The guiding structure according to claim 1, wherein said hinge portion comprises:
    a first knuckle formed on said body member;
    a second knuckle formed on said swingable member and positioned to be coaxial with said first knuckle; and
    a pivot extending through said first knuckle and said second knuckle to join said first knuckle and said second knuckle to each other;
    wherein said flexible-PWB fixing portion is integrally formed with said second knuckle.

8. The guiding structure according to claim 1, wherein said swingable member comprises a display panel to which said one end of said flexible printed wiring board is fixed.

9. The guiding structure according to claim 4, wherein said wide-width portion includes a hole through which at least a portion of said flexible-PWB insertion portion passes said wide-width portion.

10. The guiding structure according to claim 4, wherein said flexible-PWB fixing portion comprises:
    a pair of cylindrical halves formed on a casing of said swingable member and a cover member of said swingable member, respectively, said cover member being fixed to said casing.

11. The guiding structure according to claim 10, wherein said casing of said swingable member and said cover member of said swingable member comprise a first bending/guiding portion and a second bending/guiding portion which are in contact with two sides of said flexible printed wiring board to define a bending portion thereof, respectively; and
    wherein said first bending/guiding portion and said second bending/guiding portion are different from each other in shape and location to bend said flexible printed wiring board at different positions thereon when said swingable member and said body member rotate relative to each other.

12. A camera having a camera body and a swingable component hinged on said camera body, comprising:
    a hinge structure having a first knuckle fixed to said camera body and a second knuckle fixed to said swingable component coaxial with said first knuckle;
    a pivot extending through said first knuckle and said second knuckle to join said first knuckle and said second knuckle to each other;

a flexible printed wiring board extending between said camera body and said swingable component;

a flexible-PWB fixing portion formed on said swingable component to be coaxial with said pivot; and a flexible-PWB insertion portion formed on said camera body to be coaxial with said pivot and to be rotatable relative to said flexible-PWB fixing portion;

wherein one end of said flexible printed wiring board is positioned inside said swingable component;

wherein an intermediate portion of said flexible printed wiring board is drawn into said camera body through said flexible-PWB insertion portion after a portion of said intermediate portion is fixed to said flexible-PWB fixing portion; and wherein another end of said flexible printed wiring board is connected to a connector provided in said camera body.

* * * * *